(12) United States Patent
van der Wagt et al.

(10) Patent No.: US 10,761,130 B1
(45) Date of Patent: Sep. 1, 2020

(54) VOLTAGE DRIVER CIRCUIT CALIBRATION

(71) Applicant: Teradyne, Inc., North Reading, MA (US)

(72) Inventors: Jan Paul Anthonie van der Wagt, Carlsbad, CA (US); Lawrence Choi, Camarillo, CA (US); Greg Warwar, Moorpark, CA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 16/395,120

(22) Filed: Apr. 25, 2019

(51) Int. Cl.
*G01R 31/28* (2006.01)
*H02M 3/158* (2006.01)
*G01R 31/26* (2020.01)

(52) U.S. Cl.
CPC ..... *G01R 31/2834* (2013.01); *G01R 31/2601* (2013.01); *H02M 3/1584* (2013.01)

(58) Field of Classification Search
CPC ............ G01R 31/2601; G01R 31/2603; G01R 31/2607; G01R 31/2834; H02M 3/1584
USPC .......................... 327/108, 109, 403, 404, 530
See application file for complete search history.

(56) References Cited

U.S. PATENT DOCUMENTS

| | | | |
|---|---|---|---|
| 4,777,452 A | 10/1988 | Hayami et al. | |
| 5,155,451 A | 10/1992 | Gladden et al. | |
| 5,430,337 A | 7/1995 | Castello et al. | |
| 5,436,581 A | 7/1995 | Oberhauser | |
| 5,977,818 A | 11/1999 | Czarnul et al. | |
| 6,166,569 A | 12/2000 | McQuilkin | |
| 6,246,269 B1 | 6/2001 | Schuler et al. | |
| 6,252,441 B1 | 6/2001 | Lee et al. | |
| 6,859,075 B1 | 2/2005 | van der Wagt et al. | |
| 7,187,742 B1 | 3/2007 | Logue et al. | |
| 7,671,630 B2* | 3/2010 | Howe | H03K 19/018557 326/30 |
| 8,446,169 B1* | 5/2013 | Marlett | H03K 19/0005 326/30 |
| 8,446,173 B1* | 5/2013 | Faucher | H03K 19/00361 326/27 |

(Continued)

OTHER PUBLICATIONS

U.S. Appl. No. 16/395,082, filed Apr. 25, 2019, van der Wagt et al.

(Continued)

*Primary Examiner* — William Hernandez
(74) *Attorney, Agent, or Firm* — Wolf, Greenfield & Sacks, P.C.

(57) ABSTRACT

Disclosed herein are voltage driver circuits and methods of operating the same. In some embodiments, a plurality of circuit slices are provided in a voltage driver circuit, each circuit slice is controlled to switchably connect a driver output to either a high voltage level or a low voltage level via a resistor, or to disconnect the driver output from both voltage levels. The circuit slices may provide an adjustable output impedance, which may be set to match the impedance of different loads. The circuit slices may also provide adjustable voltages with low power consumption, particularly in high speed applications. A calibration procedure is disclosed herein to generate a lookup table for how to selectively connect circuit slices to supply voltages given a target output voltage.

14 Claims, 8 Drawing Sheets

(56) References Cited

U.S. PATENT DOCUMENTS

| | | | |
|---|---|---|---|
| 8,760,188 B2* | 6/2014 | Gondi | H04L 25/028 |
| | | | 326/30 |
| 8,779,819 B1* | 7/2014 | Venditti | H03K 5/086 |
| | | | 327/170 |
| 8,854,108 B1* | 10/2014 | Suzuki | H03K 19/0005 |
| | | | 326/30 |
| 9,147,620 B2 | 9/2015 | van der Wagt et al. | |
| 9,231,631 B1* | 1/2016 | Ke | H04B 1/1036 |
| 9,281,969 B2 | 3/2016 | Gondi et al. | |
| 9,397,670 B2 | 7/2016 | van der Wagt et al. | |
| 9,503,065 B1 | 11/2016 | van der Wagt et al. | |
| 9,887,710 B1* | 2/2018 | Lim | H03M 9/00 |
| 10,554,450 B2* | 2/2020 | Elzeftawi | H04L 25/0278 |
| 2004/0263204 A1* | 12/2004 | Chandler | H03K 19/0005 |
| | | | 326/30 |
| 2005/0193356 A1 | 9/2005 | Kuekes et al. | |
| 2006/0256908 A1 | 11/2006 | Ludwig | |
| 2007/0126410 A1 | 6/2007 | Figoli | |
| 2008/0284466 A1* | 11/2008 | Cranford, Jr. | H03K 17/164 |
| | | | 326/30 |
| 2010/0299644 A1 | 11/2010 | Kawai | |
| 2011/0309865 A1 | 12/2011 | Cordos | |
| 2014/0035549 A1* | 2/2014 | Hafizi | G05F 3/08 |
| | | | 323/311 |
| 2016/0065183 A1 | 3/2016 | van der Wagt | |
| 2016/0112223 A1 | 4/2016 | Kitsukawa et al. | |
| 2016/0173090 A1 | 6/2016 | Meinerzhagen et al. | |

OTHER PUBLICATIONS

U.S. Appl. No. 16/395,098, filed Apr. 25, 2019, van der Wagt et al.
U.S. Appl. No. 16/395,104, filed Apr. 25, 2019, van der Wagt et al.
[No Author Listed], LVDS Owner's Manual. Texas Instruments. 4th Edition. 2008. 111 pages. http://www.ti.com/interface/lvds-m-lvds-pecl/technical-documents.html [last accessed: Jul. 17, 2019].
Branson, Integrated Tester Pin Electronics. IEEE Design & Test of Computers. 1990;7:4-14.
Cherry et al., The design of wide-band transistor feedback amplifiers. Proceedings of the Institution of Electrical Engineers. 1963;110(2):375-389. DOI: 10.1049/piee.1963.0050.
Dettloff et al., A 32mW 7.4Gb/s Protocol-Agile Source-Series-Terminated Transmitter in 45nm CMOS SOI. IEEE International Solid-State Circuits Conference Digest of Technical Papers. Feb. 10, 2010. p. 370-371. DOI: 10.1109/ISSCC.2010.5433825.
Enz et al., Charge-Based MOS Transistor Modeling. John Wiley & Sons. 2006. Section 4.4.4. p. 41-42. ISBN: 047085541X.
Ershov et al., EDA software for verification of metal interconnects in ESD protection networks at chip, block, and cell level. 35th Electrical Overstress/Electrostatic Discharge Symposium. Sep. 2013. p. 1-7.
Esch et al., Near-Linear CMOS I/O Driver With Less Sensitivity to Process, Voltage, and Temperature Variations. IEEE Transactions on VLSI Systems. 2004;12(11):1253-7. DOI: 10.1109/TVLSI.2004.836321.
Greshichev et al., A 60-dB Gain, 55-dB Dynamic Range, 10-Gb/s Broad-Band SiGe HBT Limiting Amplifier. IEEE Journal of Solid-State Circuits. 1999;34(12):1914-20. DOI: 10.1109/4.808916.
Hatamkhani et al., A 10mW 3.6Gbps I/O Transmitter. Symposium on VLSI Circuits. Jun. 2003. p. 97-98. DOI: 10.1109/VLSIC.2003.1221172.
Knight et al., A Self-Terminating Low-Voltage Swing CMOS Output Driver. IEEE Journal of Solid-State Circuits. 1988;23(2):457-64. DOI: 10.1109/4.1007.
Kojima et al., 8Gbps CMOS Pin Electronics Hardware Macro with Simultaneous Bi-directional Capability. IEEE International Test Conference. Nov. 2012. p. 1-9. DOI: 10.1109/TEST.2012.6401543.
Kossel et al., A T-Coil-Enhanced 8.5 Gb/s High-Swing SST Transmitter in 65 nm Bulk CMOS With <-16 dB Return Loss Over 10 GHz Bandwidth. IEEE Journal Solid-State Circuits. 2008;43(12):2905-2920. DOI: 10.1109/JSSC.2008.2006230.
Laskin, On-Chip Self-Test Circuit Blocks for High-Speed Applications. Thesis submitted for MS of Applied Science Graduate Department of Electrical and Computer Engineering. University of Toronto. 2006. Chapter 2.3. p. 13-16.
Nauta et al., Analog Line Driver with Adaptive Impedance Matching. IEEE Journal of Solid-State Circuits. 1998;33(12):1992-8. DOI: 10.1109/4.735540.
O'Reilly, Series-Parallel Generation of m-Sequences. Radio and Electronic Engineer. 1975;45(4):171-6. DOI: 10.1049/ree.1975.0033.
Sayag et al., Compact Modeling and Comparative Analysis of Silicon-Chip Slow-Wave Transmission lines With Slotted Bottom Metal Ground planes. IEEE Transaction on Microwave Theory and Techniques. 2009;57(4):840-7. DOI: 10.1109/TMTT.2009.2015041.
Schneider et al., CMOS Analog Design Using All-Region MOSFET Modeling. Cambridge University Press. 2010. Section 1.2.3. p. 7-14. ISBN: 052111036X.
Tanzawa et al., High-Voltage Transistor Scaling Circuit Techniques for High-Density Negative-Gate Channel-Erasing NOR Flash Memories. IEEE Journal of Solid-State Circuits. 2002;37(10):1318-25. DOI: 10.1109/JSSC.2002.803045.
Tsividis, Operation and Modeling of the MOS Transistor. Oxford University Press. 2nd Edition. 1999. Section 4.5.2. p. 156-158. ISBN: 0195170146.
Van Der Wagt et al., 50Gb/s 3.3V Logic ICs in InP-HBT Technology. Symposium on VLSI Circuits Digest of Technical Papers. Jun. 2004. p. 326-329. DOI: 10.1109/VLSIC.2004.1346604.
Wallinga et al., Design and Analysis of CMOS Analog Signal Processing Circuits by Means of a Graphical Most Model. IEEE J. Solid-St. Circuits. 1989;24(3):672-80. DOI: 10.1109/4.32024.
Zheng et al., Capacitive Floating Level Shifter: Modeling and Design. IEEE Region 10 Conference. Nov. 2015. 6 pages. DOI: 10.1109/TENCON.2015.7373013.

* cited by examiner

VOLTAGE DRIVER CIRCUIT CALIBRATION

BACKGROUND

Electronic components, such as semiconductor devices, circuits, and printed circuit board (PCB) assemblies, are frequently tested, during and after their manufacture, using a test system such as an automated test equipment (ATE). To perform these tests, an ATE may include instruments that generate or measure test signals such that a range of operating conditions can be tested on a particular device-under-test (DUT). An instrument, for example, may generate a pattern of digital or analog signals that are applied to a semiconductor device, and may measure digital or analog signals from the semiconductor device as a response.

An ATE is frequently used to apply a test signal with a specific voltage waveform to one or more test points of the DUT. To generate such a test signal, the ATE may comprise a voltage driver that generates programmable voltage levels. A voltage driver may be single-ended and provide a programmable output voltage at a single output port for connection to a test point on the DUT. A voltage driver may alternatively be differential and generate a differential voltage signal to drive DUTs that take differential signals as input. The generated differential voltage signal comprises two voltage waveforms that are usually of opposite phase at a pair of differential outputs.

SUMMARY

Aspects of the present application are directed to a method of calibration for a voltage driver. The inventors have recognized and appreciated designs for a voltage driver that enable multiple characteristics at the driver output to be programmed, where the voltage driver includes a plurality of circuit slices that can each be programmed to switchably connect to a high supply voltage or a low supply voltage, or none of the supply voltages. Aspects of the present application provide a method to generate a lookup table of a set of control parameters for the plurality of slices as a function of output voltage. Accordingly, such a driver may enable a test system to generate waveforms that more reliably or more accurately test a semiconductor device under test.

According to some embodiments, a method for operating a voltage driver is provided. The voltage driver comprises a plurality of circuit slices each configured to switchably connect a slice output to a first supply voltage or a second supply voltage. The method comprises, for a circuit slice of the plurality of circuit slices, measuring a first set of I-V values. Each I-V value in the first set representing an output current at the slice output of the circuit slice versus a voltage difference between the slice output and the first voltage level. The method further comprises performing a fit of the first set of I-V values to obtain a first set of I-V parameters; and generating a lookup table indicating a plurality of combinations of a number of circuit slices to be connected to the first supply voltage versus an output voltage of the voltage driver based at least in part on the first set of I-V parameters.

The foregoing is a non-limiting summary of the invention, which is defined by the appended claims.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

The inventors have recognized and appreciated designs for a voltage driver circuit that enable multiple characteristics at the driver output to be programmed. These characteristics may include one or more of: voltage level, output impedance and/or time domain behavior. An adjustable output impedance, for example, may be programmed to match the impedance of different loads, providing adjustable voltages with low power consumption, particularly in high speed applications. Further, by adjusting time domain behavior of the output voltage swings, voltage peaking may be controlled. Accordingly, such a driver may enable a test system to generate waveforms that more reliably or more quickly test a semiconductor device under test.

In accordance with some embodiments, a voltage driver may be implemented with a plurality of circuit slices. Programmable control over the voltage driver may be achieved by setting switches within each of the circuit slices that change the characteristics of the output of that circuit slide. The outputs of the slices may be connected together, so as to collectively provide an output for the voltage driver. The switches may be configured to connect components of the circuit slice to one of a plurality of voltage supplies. The number of components within each slice connected to each of the plurality of voltage supplies as well as the number of such components connected to none of the voltage supplies may impact multiple characteristics at the output of the circuit slice. The characteristics at the outputs of the circuit slices may combine to impact the characteristics, including voltage, impedance and/or time domain characteristics, at the output of the voltage driver circuit.

In some embodiments, the plurality of circuit slices may be configured in groups. The components of the circuit slices within each group may be the same, but different groups may have different components. For example, the component connected to a voltage source may be a resistor. Circuit slices within each group may have resistors of the same resistance, but slices in different groups may have resistors of different values. By controlling the ratio of slices within each of the groups in which a resistor is connected to each of multiple voltage sources, the output voltage may be set. By controlling the number of such components connected to a voltage source, other characteristics, such as impedance or time domain characteristics, may be set.

Figure 1:
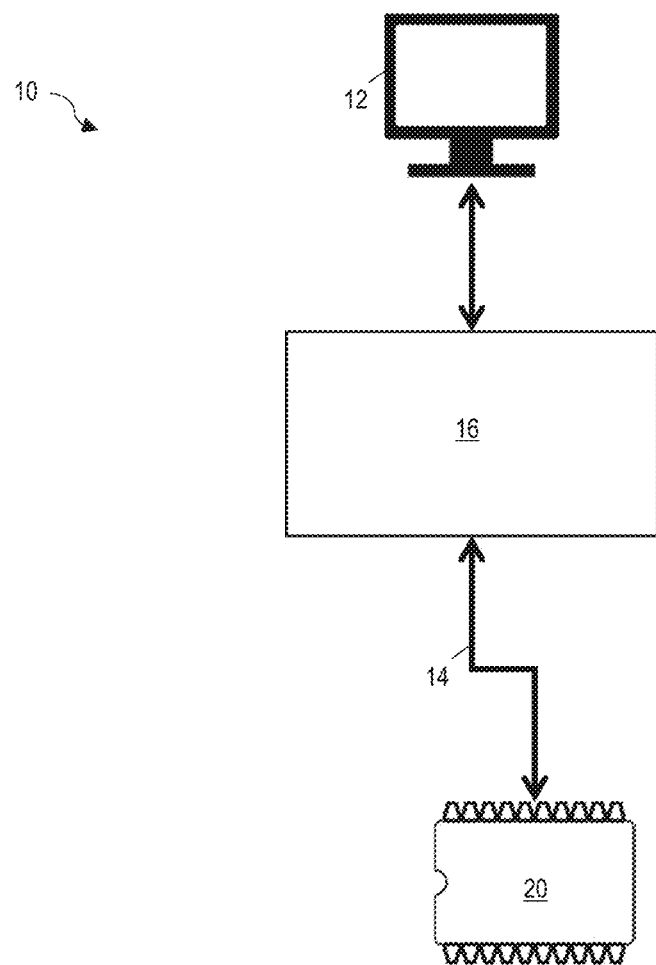
FIG. 1 is a schematic diagram of an exemplary embodiment of an automated test system in which a voltage driver circuit according to aspects of the present application may be applied.

FIG. 1 is a schematic diagram of an exemplary embodiment of an automated test system in which a voltage driver circuit according to aspects of the present application may be applied. FIG. 1 illustrates a test system 10 that contains a test computer 12 that controls a tester 16 to perform tests on a device under test (DUT) 20 in accordance to methods disclosed in the present application. In some scenarios, the tester 16 may be an automated test equipment (ATE), constructed using techniques that are known in the art. The DUT 20 may be any suitable device for testing. For example, DUT 20 may be a semiconductor device. ATE 16 may contain circuitry to generate and/or measure a test signal 14 for DUT 20. ATE 16 may include multiple instruments configured to generate or measure different types of analog or digital signals.

According to an aspect of the present application, some instruments within ATE 16 may be implemented in the form of pin electronics (PE) with a PE driver that generates output voltage signals of a designed amplitude and timing to provide to a device under test (DUT). For example, digital test instruments, which generate and/or measure digital signals, may be implemented with such PE circuits. Regardless of the specific type of instrument in which it is used, the PE may be implemented as integrated circuits (ICs) that comprise a large number of transistors, such as complementary metal-oxide semiconductor (CMOS) transistors.

It should be appreciated that FIG. 1 is a greatly simplified representation of an automated test system. For example, though not illustrated, test system 10 may include control circuitry that controls operation of instruments within ATE 16. Additionally, test system 10 may include processing circuitry to process measurements and determine whether a DUT 20 is operating correctly. Also, FIG. 1 illustrates a single signal path between ATE 16 and DUT 20. One of skill in the art will appreciate that testing a modern DUT may require hundreds or thousands of test signals to be generated and measured. Accordingly, circuitry as described herein may be duplicated many times within ATE 16 and controlled to provide synchronized test signals for testing DUT 20. Further, though FIG. 1 illustrates a scenario in which a single DUT 20 is being tested, test system 10 may be configured to test multiple devices.

Regardless of the number of instruments or other components generating or measuring test signals and the number of devices under test, test system 10 may include signal delivery components that route the signals between the DUT 20 and the instruments within ATE 16.

Further, it should be appreciated that other components as illustrated are exemplary rather than limiting. For example, although the test computer 12 is illustrated as a personal computer (PC) in FIG. 1, it should be appreciated that any suitable computing device may be used to implement a test computer, for example, a mobile device or a computer work station. Test computer 12 may be connected to a network and capable of accessing resources over the network and/or communicate with one or more other computers connected to the network.

Figure 2:
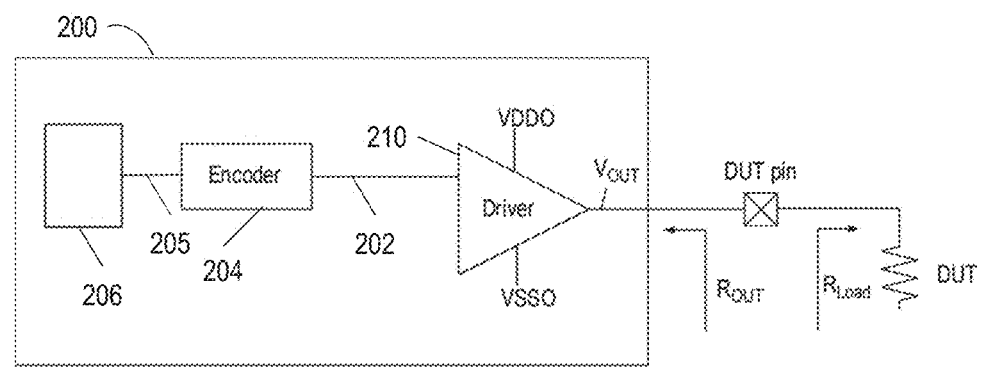
FIG. 2 is a schematic diagram showing an exemplary pin electronics (PE), according to an aspect of the present application.

FIG. 2 is a schematic diagram showing an exemplary PE 200, according to an aspect of the present application. PE 200 includes a voltage driver circuit 210 coupled to a first supply voltage VDDO and a second supply voltage VSSO, and configured to provide an output voltage at output $V_{OUT}$ in response to driver control signal 202 received from encoder 204. Encoder 204 may generate driver control signal 202 based on input data 205 received from controller 206. It should be appreciated that driver control signal 202 may be an aggregate of a plurality of control signals that set configurations of multiple components within the voltage driver circuit 210 to control the output voltage at $V_{OUT}$. While a single signal path is illustrated in FIG. 2 for driver control signal 202, it should be appreciated that embodiments of the present invention are not so limited and in some embodiments, separate control signals within driver control signal 202 may be applied to multiple control terminals of components within the voltage driver circuit 210. For example, encoder 204 may supply a control signal to each control terminals of a plurality of switches and programmable capacitors within voltage driver circuit 210.

Still referring to FIG. 2, controller 206 comprises logic, processors and/or memory elements, and may be disposed either within or external to the PE 200. Input data 205 from controller 206 may be a high speed data having data rates on the order of multiple Gbps, such as up to 10 Gbps. In some embodiments, input data 205 comprises a data stream of values of desired output voltage level versus time. In put data 205 may also comprise configuration data indicative of a target output impedance and time domain peaking behavior. Encoder 204 is configured to generate driver control signal 202 based on the received input data 205 to configure the voltage driver circuit 210 to generate an output voltage at $V_{OUT}$ with a waveform that substantially corresponds to the values indicated in input data 205. In some embodiments, a DUT may be connected to $V_{OUT}$ via DUT pin on the exterior of the PE.

According to an aspect of the application, the inventors have recognized and appreciated that when a PE such as PE 200 is used to test DUT at high data rates on the order of multiple Gbps, such as up to 10 Gbps, there are challenges in providing precise control over the output voltage levels, output impedance, and time domain behaviors of the output waveform such as peaking and slew rate. A voltage driver circuit, as will be described in detail below, may be used to address some or all of these challenges.

Referring to FIG. 2, one aspect of the present application is directed to providing an adjustable output resistance $R_{OUT}$ at the output of the voltage driver circuit 210 such that it can be set to a desired value, such as to substantially matches the load resistance $R_{Load}$ of the DUT connected to the DUT pin. Matching the load resistance in this way reduces attenuation of signals transmitted from the voltage driver circuit to the load due to impedance mismatch. Reduced attenuation may be particularly desirable at high data rates. The inventors have recognized and appreciated that the output resistance $R_{OUT}$ may be adjusted when $R_{Load}$ varies, for example when testing different types of DUT, or to account for environmental and on-die manufacturing variations on the same type of DUT. For high frequency operations, aspects of the present application may similarly apply to adjustability of the output impedance, taking into consideration reactive components in the circuit.

According to an aspect of the present application, a voltage driver circuit comprises one or more groups of circuit slices. The circuit slices within a group are connected in parallel between VSSO and VDDO. Each circuit slice also comprises a slice output, with slice outputs of circuit slices within a group coupled to a same node. Within each circuit slice, a resistor is switchably connects the slice output to one or none of supply voltages. In at least one group of circuit slices, the slice outputs are connected to a driver output of the voltage driver circuit. The inventors have recognized and appreciated that a resistor connecting the driver output to one of VSSO or VDDO contributes to $R_{OUT}$ by the resistance of the resistor, and therefore by connecting a selected number of circuit slices to the driver output, the output resistance $R_{OUT}$ may be programmable based on a parallel combination of the $R_{OUT}$ in the selected number of circuit slices.

According to some embodiments, a first resistor terminal of the resistor within each circuit slice is connected to the slice output. Each circuit slice comprises switches coupled to and controlled by control signals from an encoder to switchably connect a second resistor terminal of the resistor within the circuit slice to one of VDDO and VSSO, or disconnected from both VDDO and VSSO. When a slice output is connected the driver output, the output resistance ROUT is based on a parallel combination of circuit slices that have resistors connected to VDDO or VSSO. These circuit slices may also be referred to as "activated." Circuit slices with the resistor disconnected to either VDDO and VSSO may be referred to as "disconnected" or "deactivated."

According to some embodiments, the circuit slices may be implemented as circuit modules that have the same design and have the same number of circuit elements to simplify circuit design, although it is not a requirement that all circuit slices be implemented identically. In some embodiments, the switches are metal-oxide semiconductor field-effect transistors (MOSFET) such as but not limited to Si MOSFET. In one embodiment, the circuit slices comprise Si CMOS and are fabricated using silicon semiconductor manufacturing techniques known in the art. The inventors have appreciated and recognized that implementing part or all of the voltage driver circuit with Si CMOS technology may reduce power consumption. In such an implementation, each circuit slice may be controlled to be in at least one of three states: a high state, with switches connecting the resistor to VDDO; a low state, with switches connecting the resistor to VSSO; and a tri-state, with the first resistor terminal not connected to either VDDO or VSSO, and thus in a floating state.

Aspects of the present application also provide control of output voltage at the driver output. In some embodiments, an output voltage at the slice outputs of a group of circuit slices is adjustable by selectively connecting a first number of circuit slices to VDDO, and selectively connecting a second number of circuit slices to VSSO, or connecting a first ratio of circuit slices to VDDO, and selectively connecting a second ratio of circuit slices to VSSO. In some embodiments, connecting a circuit slice to VDDO or VSSO comprises controlling switches within the circuit slice to connect the first resistor terminal of the resistor to VDDO or VSSO. It should be appreciated that when 100% of the activated circuit slices within a group are connected to VDDO, the open circuit output voltage at the slice outputs will be VDDO. Similarly, when 100% of the activated circuit slices are connected to VSSO, the open circuit output voltage at the slice outputs will be VSSO. Thus when some ratio of the activated circuit slices are connected to VDDO, and the rest of the activated circuit slices are connected to VSSO, the output voltage will be at an intermediate level between VSSO and VDDO.

Because output resistance is adjusted by the number of activated slices, and output voltage is adjusted by the ratio of slices connected to VDDO vs. VSSO within the activated slices, aspects of the present application can provide independent adjustability of output resistance and output voltage.

The number of steps, or number of different values to which the output voltage of the driver can be set, is dependent on the number of circuit slices provided in parallel between the two supply voltages. The step-size, or granularity at which the output voltage of the driver can be changed, depends on the difference between the voltage represented by the smallest step relative to the largest step, divided by the number of steps. Finer control over the output voltage over a relatively large voltage range may be provided with groups of circuit slices, with each group providing output voltages controllable with different step sizes. The output voltages of the groups may be combined to provide the output of the voltage driver.

In some embodiments, the voltage driver circuit may further comprise segmented groups of slices, functioning as a segmented voltage divider ladder. A first group of most-significant bit (MSB) slices, or "coarse slices," have slice outputs directly connected to the driver output, while a second group of less-significant bit (LSB) slices, or "fine slices," have slice outputs connected to the driver output through a string of one or more resistors. More than one LSB segments, and thus more than one groups of LSB or fine slices may be provided to provide additional fine adjustability. The coarse slices and fine slices are connected to the driver output via a network of resistor ladders, such that a change in voltage at slice outputs of the coarse slices contributes to a coarse step that is bigger than a fine step resulting from a similar level of change in voltage at slice outputs of fine slices. The segmented voltage driver circuit as described herein may use any voltage divider resistor ladder network known in the art, such as but not limited to a R-2R ladder, a R-8R ladder. In addition to providing coarse and fine levels of adjustments of output voltage at the driver output, it should be appreciated that such a segmented voltage divider ladder provides similar coarse and fine levels of output resistance adjustability, with a change in output resistance at slice outputs of the coarse slices contributing to a coarse step in $R_{OUT}$, compared to that from the same change in output resistance at slice outputs of the fine slices.

Some aspects of the present application are directed to a method for operating a voltage driver circuit of the type as described herein. In some embodiments, the method comprises a calibration procedure for the programmable output impedance, and output voltage. The calibration may be performed prior to and during operation of the PE for testing the DUT, by for example providing one or more control parameters to the encoder that specifies the number of circuit slices to be activated, and if so to be connected to which supply voltage, as well as the programmable capacitance for activated slices. Such adjustments may be made in response to a user or programmed input that indicates a change in voltage output is needed. In some embodiments, control parameters may be stored in memories on the PE, such as memories within controller 206 as shown in FIG. 2.

In one embodiment, calibration may be performed for one or more of the plurality of circuit slices in the voltage driver, for example in a representative circuit slice. A first set of I-V values, or current versus voltage values are first obtained by measuring an output current at the slice output of the circuit slice while measuring a voltage difference V between the slice output and VDDO. The first set of I-V values may then be fitted into a known relationship to obtain a first set of I-V parameters that are characteristic of components between the slice output and VDDO within the circuit slice. For example, the first set of I-V parameters may include a transconductance, or a transimpedance. The fit may be a polynomial fit and the first set of I-V parameters may include multiple orders of transconductance, or a transimpedance values. In one example, a first set of three I-V points are measured, where one of the I-V point has I=0. By forcing output current to zero, using for example a parametric measurement unit (PMU), the inventors have recognized and appreciated that the measured V would represent a directly measured value of VDDO.

In one embodiment, measurement of the first set of I-V values may only need to be performed for a few set of values to save time during the calibration process and to reduce costly delays during testing. The set of values may include no more than 10, or no more than 3 I-V values. In the case of a polynomial fitting, generally the number of I-V values to be measured is P+1, where P is the order of polynomial fit.

Further according to the embodiment, a second set of I-V values, are obtained by measuring an output current at the slice output of the circuit slice while measuring a voltage difference V between the slice output and VSSO. The second set of I-V values may then be fitted into a known relationship to obtain a second set of I-V parameters that are characteristic of components between the slice output and VSSO within the circuit slice.

The measured first and second set of I-V parameters of the representative circuit slice may then be used to generate a lookup table. Entries of the lookup table contain combinations of $n_h$, or the number of active slices to be connected to VDDO, versus a target output voltage. The number of active slices to be connected to VDDO, or $n_s$, may be obtained by subtracting $n_h$ from N, which is the total number of active slices. The lookup table may be control parameters stored in memories on the PE, such as memories within controller 206, within encoder 204, or in other suitable components on the PE. During operation of the voltage driver, an encoder receives a target output voltage value, and generate a plurality of control signals based on the lookup table to control switching of switches within the plurality of circuit slices such that $n_h$ active slices are connected to VDDO, such that the target output voltage is accurately provided at an output of the voltage driver.

Figure 3:
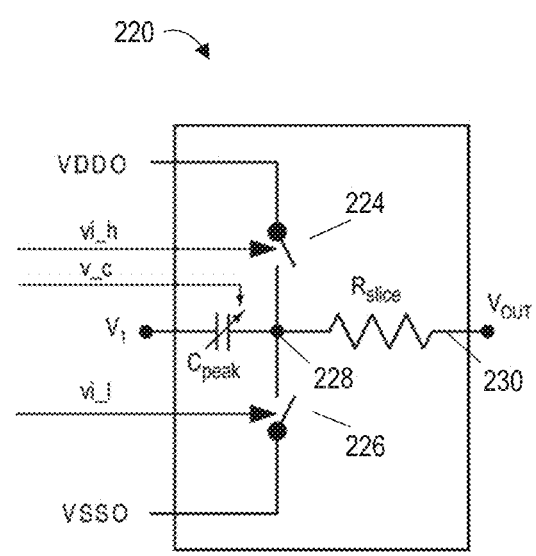
FIG. 3 is a schematic diagram of a circuit slice in an exemplary voltage driver circuit, according to some embodiments.

FIG. 3 is a schematic diagram of a circuit slice 220 in an exemplary voltage driver circuit, according to some embodiments. Circuit slice 220 comprises a resistor $R_{slice}$ having a first resistor terminal 230 connected to a slice output $V_{OUT}$, a first switch 224 connected between VDDO and a second resister terminal 228 of $R_{slice}$, and a second switch 226 connected between VSSO and the second resister terminal 308. Therefore slice output $V_{OUT}$ is connected to one of the supply voltages VDDO/VSSO through one of switches 224, 226 in series with resistor $R_{slice}$. The inventor has appreciated and recognized that the switch and series $R_{slice}$ arrangement between a supply voltage and the slice output is a low power consumption configuration that provides a large output voltage range at the slice output, at nearly the full rail-to-rail voltage range between VSSO and VDDO when the slice output is connected to an open load. Switches 224 and 226 are controlled to open/close in response to control signals vi_h and vi_l, respectively, that are received at control terminals of switches 224 and 226.

Still referring to FIG. 3, circuit slice 220 comprises a capacitor $C_{peak}$ having a first capacitor terminal that connects to the second resistor terminal 228, and a second capacitor terminal that connects to a voltage $V_1$. Voltage V1 may be a supply voltage or a reference voltage such as ground within the PE, according to some embodiments. Capacitor $C_{peak}$ may have an adjustable capacitance, and is used to adjust a time constant of circuit slice 220 around a signal transition, such that the time domain behavior such as peaking of a voltage at the slice output $V_{OUT}$ can be adjusted. Capacitor $C_{peak}$ may include a control terminal such that the capacitance value of capacitor $C_{peak}$ is adjusted based on a control signal v_c received at the control terminal of $C_{peak}$. Control signal v_c along with control signals vi_h and vi_l may be received as part of driver control signal 202 from encoder 204 as shown in FIG. 2.

Details of several embodiments of the present application will be described below with reference to FIGS. 4-7.

Figure 4:
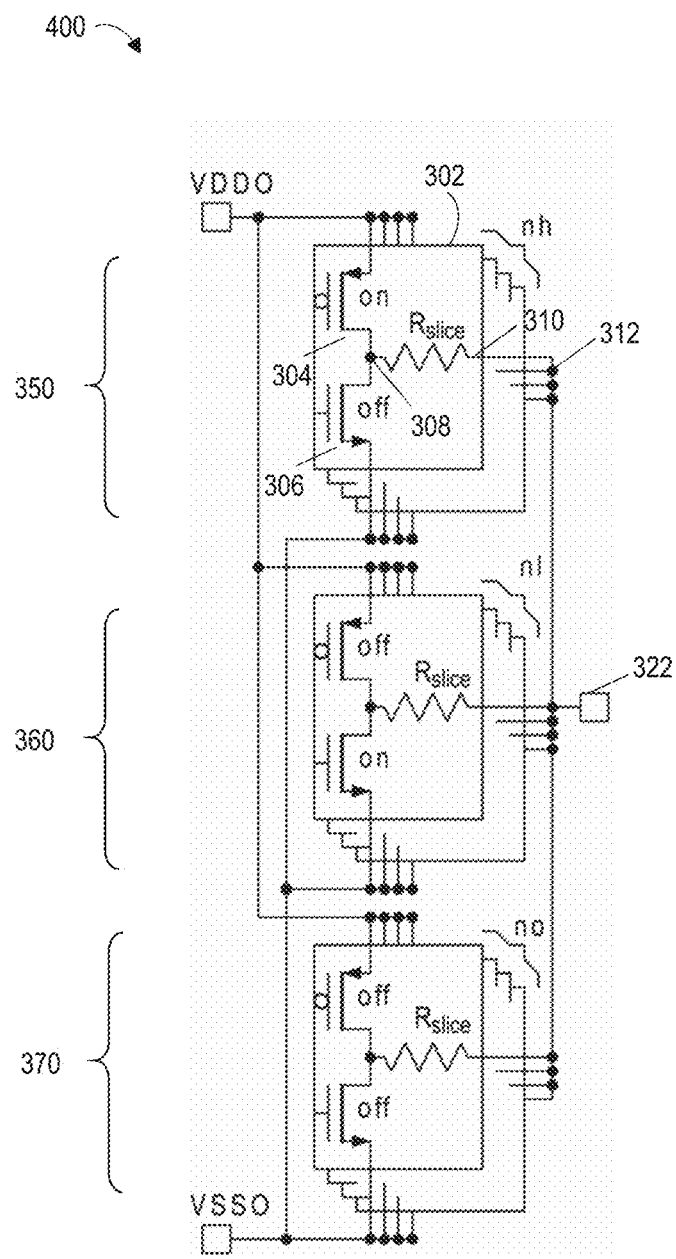
FIG. 4 is a schematic diagram of a group of circuit slices in an exemplary voltage driver circuit, according to some embodiments.

FIG. 4 is a schematic diagram of a group of circuit slices 400 in an exemplary voltage driver circuit, according to some embodiments. The group of circuit slices 400 comprises a plurality of N circuit slices 302 that are each connected in parallel between supply voltages VDDO and VSSO. While FIG. 4 shows that each circuit slice 302 is substantially identical to each other, it should be appreciated that aspects of the present application are not so limited and that it is not a requirement that circuit slices within one group be identical.

In the embodiment shown in FIG. 4, circuit slice 302 comprises a resistor $R_{slice}$ having a first resistor terminal 310 connected to a slice output 312, a first switch 304 connected between VDDO and a second resister terminal 308 of $R_{slice}$, and a second switch 306 connected between VSSO and the second resister terminal 308. Slice outputs 312 are connected together to a voltage output 322 of the group of slices. Within each circuit slice 302, the slice output 312 is connected to one of the supply voltages through one of switches 304, 306 in series with resistor $R_{slice}$. The inventor has appreciated and recognized that the switch and series $R_{slice}$ arrangement between a supply voltage and the slice output is a low power consumption configuration that provides a large output voltage range at the slice output, at nearly the full rail-to-rail voltage range between VSSO and VDDO when the slice output is connected to an open load. In some embodiments, switches 304 and 306 are implemented with Si CMOS to reduce manufacturing cost and reduce power consumption. It should be appreciated that while $R_{slice}$ is represented by a single resistor symbol in FIG. 4, implementation of $R_{slice}$ is not limited to a single resistor and may comprise, for example, one or more resistors as well as incorporation of static and dynamic resistances in other components on the circuit.

Still referring to FIG. 4, switches 304 and 306 within each circuit slice 302 may be controlled, for example by driver control signal 202 as shown in FIG. 2, to selectively connect $R_{slice}$ to one of the supply voltages VDDO, VSSO, or neither supply voltage. A controller such as controller 206 as shown in FIG. 2 may configure the group 400 to deactivate no number of circuit slices 370, where both switches 304 and 306 are turned off. Circuit slices 350 and 360 are activated slices, having nh number of "high" slices connected to VDDO by turning on switches 304 while switches 306 are off, and nl number of "low" slices connected to VSSO by turning on switches 306 while switches 304 are off. The number of activated slices nh+nl may be selected to adjust the output impedance of the group of circuit slices 400 at output IO_DUT, while an output voltage level at voltage output 322 may be adjusted by programming the number nh and nl within activated slices.

FIG. 4 illustrates that switches 304 and 306 are each implemented by single transistors. It should be appreciated that switches may be implemented in other ways, and is not so limited.

Figure 5:
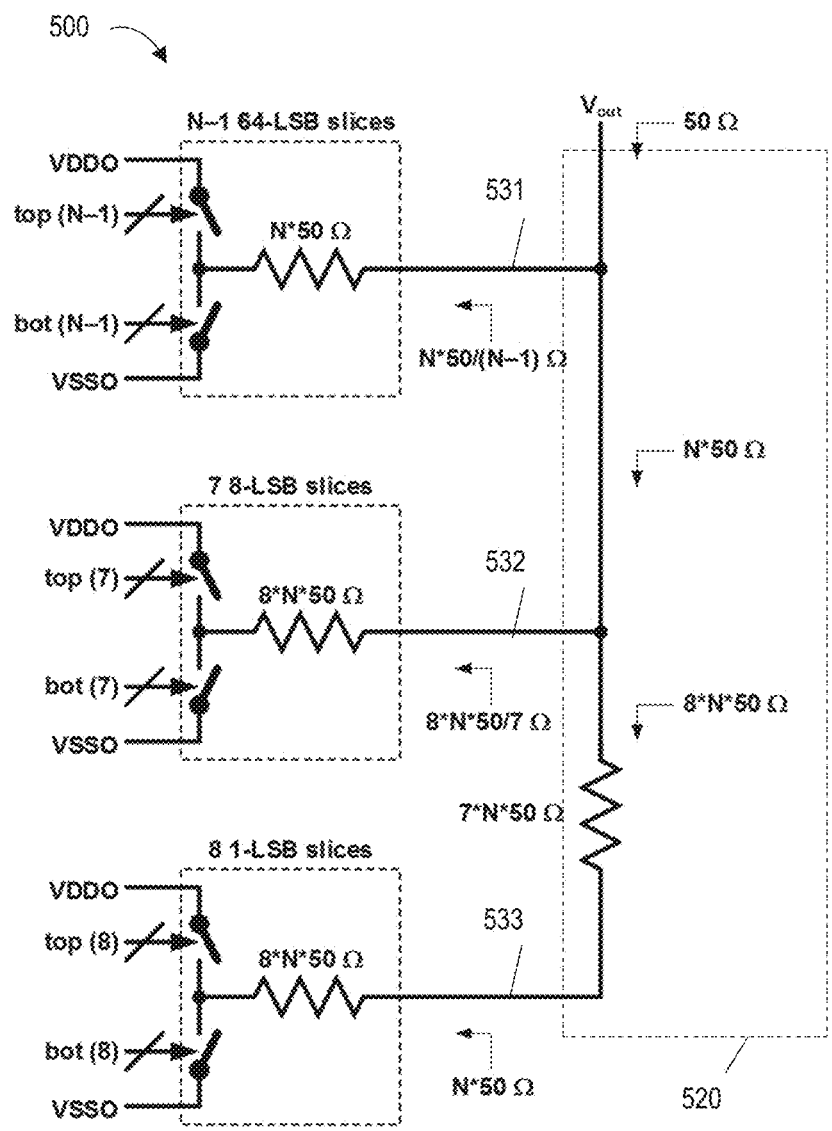
FIG. 5 is a schematic diagram of a segmented voltage driver circuit, according to some embodiments.

FIG. 5 is a schematic diagram of a segmented voltage driver circuit in which multiple groups of circuit slices may be used to expand the range of voltages that may be generated by a driver circuit, according to some embodiments. FIG. 5 shows a voltage driver circuit 500 that comprises a first segment of N−1 64-LSB slices, or coarse slices connected in parallel, a second segment of 7 8-LSB slices connected in parallel, as well as a third segment of 8 1-LSB slices connected in parallel. Here N is the number of 64-LSB slices that would result in a parallel output resistance of 50Ω.

In FIG. 5, the slice outputs of each circuit slices within the first segment of 64-LSB slices are directly coupled to a voltage output $V_{out}$, and each circuit slice within the first segment has a resistor of N×50Ω. The second and third segments of circuit slices are connected to $V_{out}$ through a string of resistor network 520. Each circuit slice within the second and third segment has a resistor of 8×N×50Ω. In the embodiment shown in FIG. 5, the bottom part of resistor network 520 is configured to form a R-8R divider network. The output 531 of the first segment and output 532 of the second segment of circuit slices are coupled together, while output 532 of the second segment of circuit slices and output 533 of the third segment of slices are connected via a resistor of 7×N×50Ω within resistor network 520.

In FIG. 5, output impedance at $V_{out}$ is fixed by the number of slices shown. But in general, more slices of each variety are included to be able to adjust the output impedance either lower or higher than 50Ω. This is also done to be able to correct for on-die resistances and FET impedances coming out different from the ideal values, Furthermore, some of these slices may have different peaking capabilities than other slices as desired by practical considerations constraining the actual slice designs.

Figure 6A:
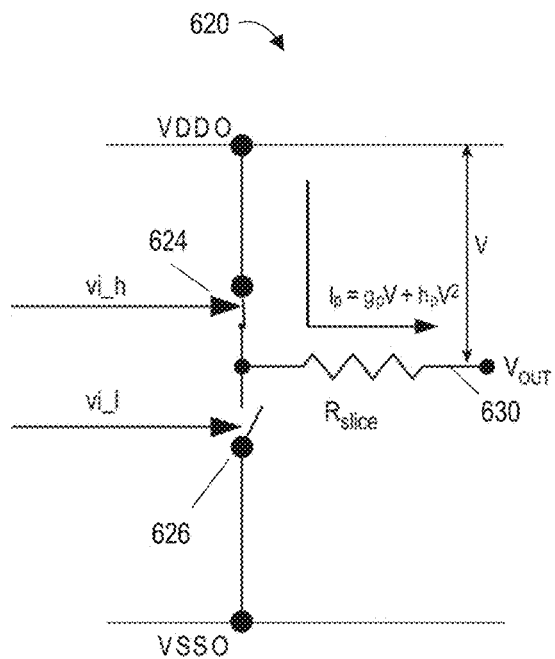
FIGS. 6A and 6B are schematic diagrams illustrating I-V measurement of a circuit slice during calibration process, according to some embodiments.
Figure 6B:
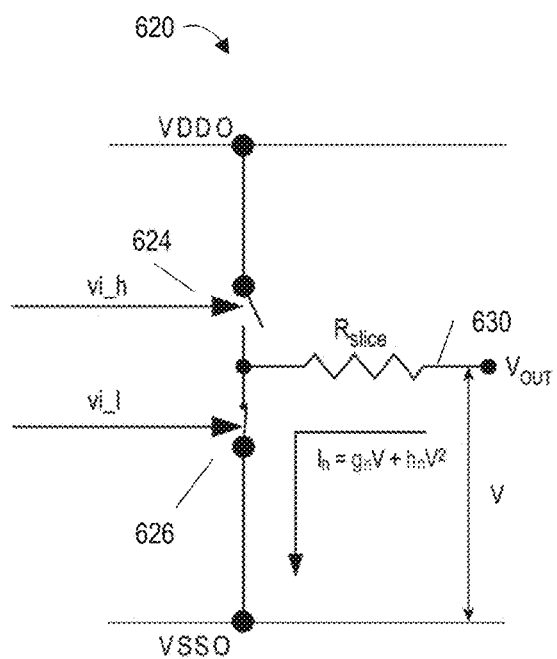

FIGS. 6A and 6B are schematic diagrams illustrating I-V measurement of a circuit slice during calibration process, according to some embodiments. FIGS. 6A and 6B show a circuit slice 620 that is similar to circuit slice 220 shown in FIG. 3 and discussed above. In FIG. 6A, switch 624 is closed to coupled slice output 630 to VDDO via resistor $R_{slice}$, while switch 626 is open to disconnect slice output 630 from VSSO. A series of I-V measurements are performed to capture output current $I_p$ as a function of V. V is the voltage difference between VDDO and $V_{OUT}$ at the slice output 630. In FIG. 6B, switch 626 is closed to coupled slice output 630 to VSSO via resistor $R_{slice}$, while switch 624 is open to disconnect slice output 630 from VDDO. A series of I-V measurements are performed to capture output current $I_n$ as a function of V. V is the voltage difference between VSSO and $V_{OUT}$ at the slice output 630.

The inventors have appreciated and recognized that two parameters, g and h may be used to describe the measured $I_p$-V and $I_n$-V relationship:

$$I_p(V) = g_p V + h_p V^2 \quad (Eq.\ 1)$$

$$I_n(V) = g_n V + h_n V^2 \quad (Eq.\ 2)$$

Eqs. 1 and 2 may capture essential non-linearity of switches 624, 626 in series with a resistor, for example when switches 624/626 comprises a pull up/pull down FET. It should be appreciated that fewer than or more than two coefficients may be used to describe I-V. The coefficients g and h may be related to implementations of switches 624, 626, and are not always identical.

Higher order terms may be added to Eqs. 1 and 2 to fit the I-V characteristics better, for example using higher order polynomial fit. With P number of orders (P=2 for Eqs. 1 and 2 for example), generally a set of P+1 pair of I-V points are needed in a measurement to determine the I(V) coefficients. It should be appreciated that parameters $h_p$, $h_n$ may be negative.

The inventors have appreciated and recognized that when circuit slices within a group of circuit slices are selectively controlled to be activated and connected to either one of the two supply voltages, the following formula may be used to describe the I-V relationship at an output port where all slice outputs of the circuit slices are connected together:

$$n_h I_p(V_{out}) - (n_s - n_h) I_n(V_{out}) = \frac{V_{out} - V_t}{R_t}. \quad (Eq.\ 3)$$

In Eq. 3, $n_h$ and $n_s$ are circuit slices that are connected to VDDO and VSSO, respectively and $n_h + n_s = N$, where N is the total number of active slices. In one embodiment with segmented groups of circuit slices as discussed above in relation with FIG. 5, $n_h$ is the active segments stated high in LSBs, and is an integer ranging from 0 to n, where n is the effective number of 1-LSB active segments for the embodiment shown in FIG. 5. $n_h$ may also be represented by a code $x = n_h/n$. $I_p$ and $I_n$ are output currents in active slices that are connected to VDDO and VSSO, respectively. $V_t$ and $R_t$ are the load termination voltage and load termination resistance of a load connected to output $V_{out}$.

Therefore knowing $I_p(V)$ and $I_n(V)$ as fit by the measurement shown in FIGS. 6A, 6B, the expected total output current going into load $R_t$, $V_t$ can be calculated as a function of $V_{out}$. Consider the simplest case where $g_p = g_n = g$ and $h_p = h_n = 0$, Eq. 3 provides that $I_p(V_{out}) = g(V_{DDO} - V_{out})$ and $I_n(V_{out}) = g(V_{out} - V_{SSO})$. This yields a linear relationship between $n_h$ and $V_{out}$. But if $g_p$ and $g_n$ are unequal and/or $h_p$, $h_n$ are included, the $n_h(V_{out})$ function is non-linear. The inventors have appreciated and recognized that it is not necessary to invert Eq. 3 and obtain $V_{out}(n_h)$. Eq. 3 directly provides $n_h(V_{out})$ for given $R_t$, $V_t$ after very simple algebra, if $I_p(V)$ and $I_n(V)$ are known.

The inventors have appreciated and recognized that Eq. 3 allows simple computation of relevant $n_h(V_{out})$ (or $V_{out}(n_h)$) for any given DUT termination voltage $V_t$ and resistance $R_t$, while small errors may possibly result from the simple quadratic or higher order I-V assumptions in Eqs. 1 and 2. We merely need to determine the four parameters $g_p$, $h_p$, $g_n$, and $h_n$ from a handful of individual slice measurements. The inventors appreciated and recognized that these measurements can be made while no load is present, a condition also known as the "open load" condition, by using circuitry already connected to the driver output pin on the Si die that can route voltages and modest-level currents to a few dedicated Si die pins that connect to an external measurement apparatus. The open load condition can be simply realized in the ATE system 10 by having no DUT 20 present. Once the Ip(V) and In(V) are so obtained to a desired level of accuracy, Eq. 3 may be used to compute the calibrated $n_h(V_{out})$ for any given $R_t$, $V_t$, which depend on DUT 20 and may typically be assumed known for a given DUT 20. It should be appreciated that embodiments of the present application is not limited to using an open load condition. For example, a person of ordinary skills in the art will recognize that Eqs. 1-3 may be adopted for conditions when a single load is present with a known impedance characteristic.

In some embodiments, when measuring $I_p$-V or $I_n$-V with three I-V points, one of the points is selected to be I=0 at V=0, i.e. (0, 0). V is the (negative of the) difference between $V_{out}$ and a local rail voltage $V_{DDO}$ or $V_{SSO}$, which is sometimes not precisely known. VDDO and VSSO may be obtained implicitly from fitting a particular slice to a full set of three I-V points. The inventors have appreciated and recognized that it is desirable to obtain accurate information near V=0 correct. In one example, one of the three points may be chosen to be the rail point (V=0), i.e. for $I_p$ ($I_n$) with the circuit slice set to high (low), a zero current can be forced using a PMU, and $V_{out}$ is measured, which yields the relevant local $V_{DDO}$ ($V_{SSO}$). In some embodiments, for $I_p$ and $I_n$ the fitting points are densest around $V_{out}$ for which many circuit slices of that type would be on, i.e. near $V_{DDO}$ and $V_{SSO}$ respectively.

Figure 7:
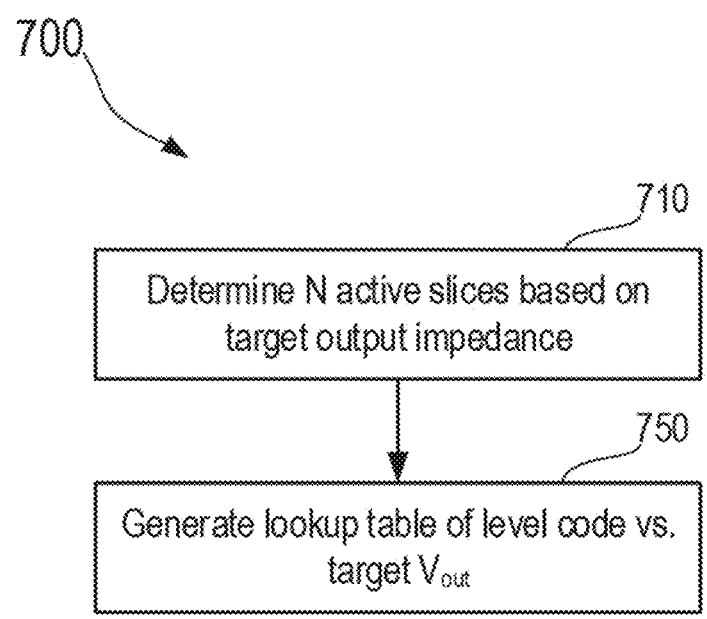
FIG. 7 is a flow diagram illustrating an exemplary method for operating a voltage driver that provides driver calibration, according to some embodiments.

FIG. 7 is a flow diagram illustrating an exemplary method 700 for operating a voltage driver that provides driver calibration, according to some embodiments. At act 710 of method 700, the number of circuit slices N to be made active is determined to match the output impedance of the voltage driver to a target impedance, such as the impedance $R_t$ of the load. In some embodiments, the voltage driver comprises a segmented voltage driver circuit comprising multiple groups of circuit slices, such as the voltage driver circuit 500 as shown in FIG. 5. In such an embodiment, N may be the effective active coarse switches to be activated. At act 750, a calibration procedure is performed to generate a lookup table of level code x as a function of target output voltage. As voltage output from coarse slices has a bigger contribution on output voltage compared to the fine slices, the chosen effective number of active coarse slices N affects programming of the voltage driver output $V_{out}$, because the total number of effective levels depends on N. For example, if N is chosen to be 16, the total number of effective 1-LSB levels is n=64×N for voltage driver circuit 500. An example of act 750 is described in detail below in relation to FIG. 8.

Figure 8:
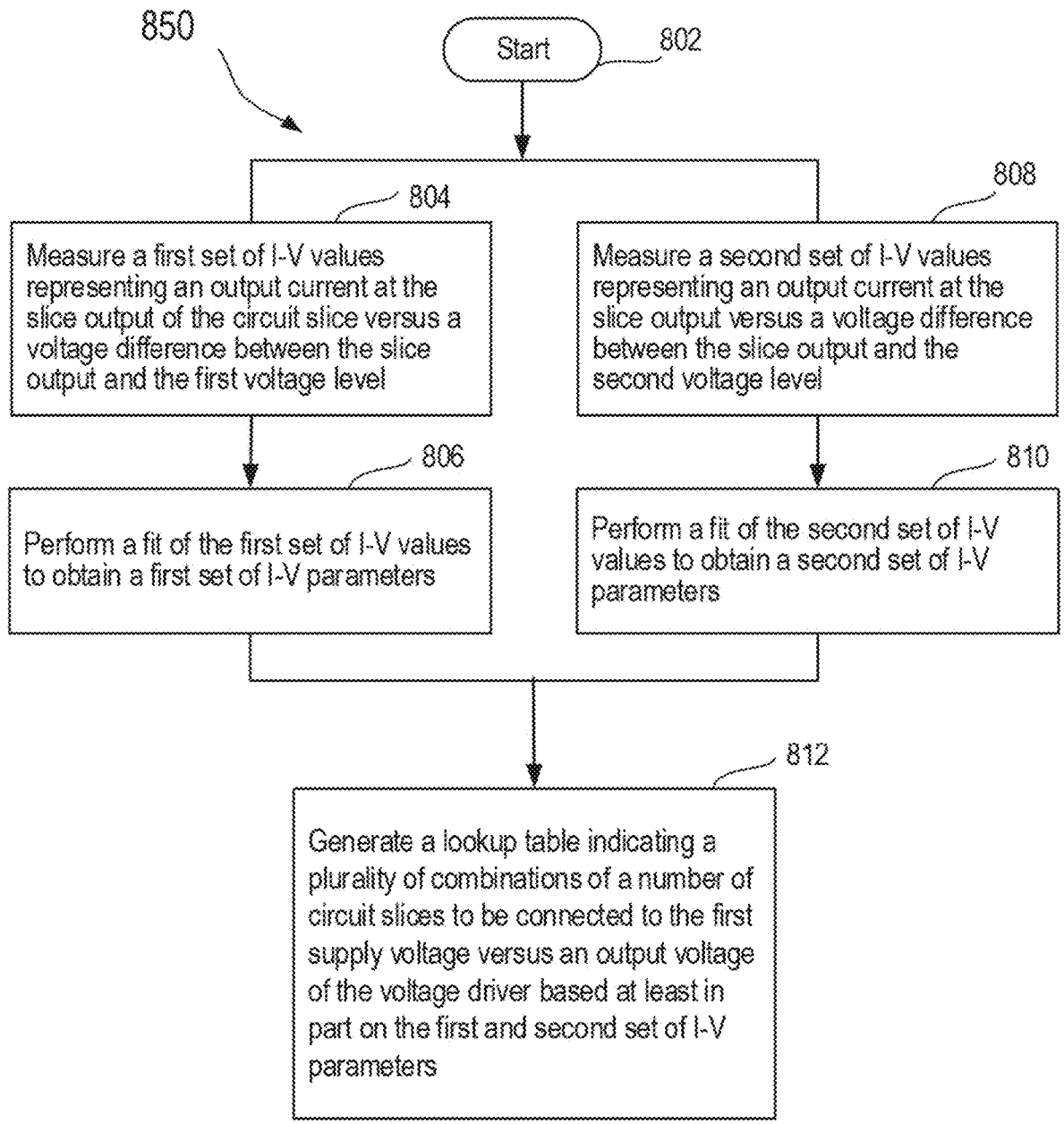
FIG. 8 is a flow diagram illustrating an exemplary method for operating a voltage driver that provides driver calibration, according to some embodiments.

FIG. 8 is a flow diagram illustrating an exemplary method 850 for operating a voltage driver that provides driver calibration, according to some embodiments. Method 850 starts at act 802, and proceeds with, at act 804, measuring a first set of I-V values in a circuit slice. Each I-V value in the first set representing an output current at the slice output of the circuit slice versus a voltage difference between the slice output and the first voltage level. At act 806, the measured first set of I-V values are fit to obtain a first set of I-V parameters. For example, a first set of I-V parameters $g_p$ and $h_p$ may be obtained by fitting the first set of I-V values according to Eq. 1 as discussed above.

Further at act 808, method 850 includes measuring a second set of I-V values in the circuit slice. For example, a second set of I-V parameters $g_n$ and $h_n$ may be obtained by fitting the second set of I-V values according to Eq. 2. Each I-V value in the first set representing an output current at the slice output of the circuit slice versus a voltage difference between the slice output and the second voltage level. At act 810, the measured second set of I-V values are fit to obtain a second set of I-V parameters.

Still referring to FIG. 8, at act 812, a lookup table is generated based on the first and second set of I-V parameters. The lookup table indicates a plurality of combinations of a number of circuit slices to be connected to the first supply voltage versus an output voltage of the voltage driver, such as $n_h(V_{out})$. For example, the lookup table may comprise entries indicating pairs of $n_h$-$V_{out}$ values calculated using Eq. 3 by plugging in the set of fitted parameters $g_p$, $h_p$, $g_n$ and $h_n$. Because Eq. 3 also contains the load termination voltage $V_t$ and load termination resistance $R_t$, the equation can be used to determine $n_h(V_{out})$ for any given load conditions, even though the first set of I-V values and the second set of I-V values are measured at open load condition. Thus method 850 may provide calibration of a voltage driver for use in varying load conditions by performing calibration in one set of load condition, which can save time in testing during either product development or manufacturing. It should be appreciated that it is not a requirement to store multiple combinations of $n_h(V_{out})$ in a lookup table, and that a lookup table can be a single pair of $n_h$-$V_{out}$ values determined based on an equation. In some embodiments, a known relationship such as Eq. 3 may be implemented as executable instructions stored in a memory and/or partly as a field-programmable gate array (FPGA) that can process parameters such as $g_p$, $h_p$, $g_n$ and $h_n$ to generate one or more $n_h(V_{out})$ as a lookup table. In such embodiments, as $n_h(V_{out})$ is generated on the fly based on a given load condition, there is no need for storage of multiple lookup tables, which reduces the amount of data storage space requirement for memory on the voltage driver.

Having thus described several aspects of at least one embodiment of this invention, it is to be appreciated that various alterations, modifications, and improvements will readily occur to those skilled in the art.

For example, while some embodiments as described herein use two supply voltage rails, it should be appreciated that aspects of the present application is not so limited and may be implemented with more than two voltage rails, with one or more circuit slice connected between the more than two voltage rails. Alternatively or additionally, one of the supply voltage rails may be connected to ground.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

For example, an output resistance or output impedance can be said to be "match" to a load resistance or load impedance in some embodiments. It should be appreciated that these impedances or resistances need not be identical. To the contrary, impedances may be matched if, over some frequency range of interest, or at a nominal frequency of interest, the impedances or resistances differ by less than some threshold amount. The threshold may be specified as a relative value, such as a percentage difference. As an example, impedances in some embodiments may be considered matched if they differ by less than 5%. Though, in other embodiments, differences of up to 10%, 15% or 20% may be regarded as matched. The differences regarded as acceptable in any specific embodiment may depend on whether such a change in impedance creates a reflection large enough to be significant in impacting performance of an electronic device. Accordingly, it shall be appreciated that the specific threshold used in regarding impedances as "matched" or "consistent" is not critical to the invention. In other embodiments, the threshold may be specified in terms of Ohms. For example, a difference of 20Ω or less may be regarded as matched. In other embodiments, differences of 1Ω, 5Ω or 10Ω may be regarded as "matched" or "consistent."

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method for operating a voltage driver comprising a plurality of circuit slices each configured to switchably connect a slice output to a first supply voltage or a second supply voltage, the method comprises:
    for a circuit slice of the plurality of circuit slices,
        measuring a first set of I-V values, each I-V value in the first set representing an output current at the slice output of the circuit slice versus a voltage difference between the slice output and the first supply voltage;
        performing a fit of the first set of I-V values to obtain a first set of I-V parameters;
        generating a lookup table indicating a plurality of combinations of a number of circuit slices to be connected to the first supply voltage versus an output voltage of the voltage driver based at least in part on the first set of I-V parameters.

2. The method of claim 1, wherein measuring the first set of I-V values comprises:
    connecting the circuit slice to the first supply voltage, and disconnecting the circuit slice from the second supply voltage.

3. The method of claim 1, wherein measuring the first set of I-V values comprises:
    setting an output current value to be zero, and measuring a voltage difference between the slice output and the first supply voltage.

4. The method of claim 3, wherein the first set of I-V values comprises no more than 10 I-V values.

5. The method of claim 4, wherein the first set of I-V values comprises 3 I-V values.

6. The method of claim 1, further comprising:
    for the circuit slice of the plurality of circuit slices:
        measuring a second set of I-V values, each I-V value in the second set representing an output current at the slice output versus a voltage difference between the slice output and the second supply voltage;
        performing a fit of the second set of I-V values to obtain a second set of I-V parameters;
    wherein
        generating the lookup table is based at least in part on the second set of I-V parameters.

7. The method of claim 6, wherein:
    measuring the second set of I-V values comprises connecting the circuit slice to the second supply voltage, and disconnecting the circuit slice from the first supply voltage.

8. The method of claim 1, wherein generating the lookup table is further based on an output impedance.

9. The method of claim 8, wherein generating the lookup table is further based on a termination voltage of a device-under-test (DUT).

10. The method of claim 9, wherein measuring the first set of I-V values comprises connecting the slice output of the circuit slice to an open load.

11. The method of claim 1, wherein performing the fit of the first set of I-V values comprises performing a polynomial fit.

12. The method of claim 1, further comprising:
    receiving from a controller first data comprising an indication of a target output voltage;
    determining, with an encoder, a first number of circuit slices to be connected to the first supply voltage based on the target output voltage and the lookup table;
    in response to determining the number of circuit slices to be connected to the first supply voltage, transmitting, with the encoder, control signals to the plurality of circuit slices to cause the first number of circuit slices to be connected to the first supply voltage.

13. The method of claim 12, wherein each circuit slice of the plurality of circuit slices comprises a resistor, and each circuit slices is configured to switchably connect the slice output to the first supply voltage or the second supply voltage via the resistor, wherein slice outputs of the plurality of circuit slices are coupled to an output port of the voltage driver, the method further comprises:
    selecting an output impedance by selectively connecting a second number of circuit slices of the plurality of circuit slices to either the first supply voltage or the second supply voltage.

14. The method of claim 13, further comprising:
    transmitting, with the encoder, control signals to the plurality of circuit slices to cause a third number of circuit slices to be connected to the second supply voltage, wherein the third number is the difference between the second number and the first number.

* * * * *